United States Patent [19]
Wendt et al.

[11] Patent Number: 5,194,823
[45] Date of Patent: Mar. 16, 1993

[54] MODULATION MEANS FOR AN RF POWER AMPLIFIER

[75] Inventors: Peter Wendt, Augsburg; Gerold Friedrich, Neufahrn, both of Fed. Rep. of Germany

[73] Assignee: Siemens Aktiengesellschaft, Munich, Fed. Rep. of Germany

[21] Appl. No.: 802,047

[22] Filed: Dec. 3, 1991

[30] Foreign Application Priority Data

Dec. 3, 1990 [DE] Fed. Rep. of Germany ....... 4038534

[51] Int. Cl.$^5$ .............................................. H03G 3/20
[52] U.S. Cl. ..................................... 330/137; 330/279; 375/60; 375/68; 455/126; 455/127
[58] Field of Search ............... 330/129, 137, 138, 279; 375/60, 68, 71; 455/126, 127

[56] References Cited

U.S. PATENT DOCUMENTS 4,592,073 5/1986 Watanabe ..................... 455/126 X
4,706,262 11/1987 Ohta ............................ 455/126 X

FOREIGN PATENT DOCUMENTS 1297703 2/1970 Fed. Rep. of Germany .
2835751 7/1980 Fed. Rep. of Germany .
2904011 11/1981 Fed. Rep. of Germany .
3221911 11/1983 Fed. Rep. of Germany .

OTHER PUBLICATIONS

"Problems with Amplitude Modulation of Transistorized Power Stages", J. Stammelbach, Standard Elektrik Lorenz AG, Stuttgart, West Germany, Jun. 1976, vol. 30, No. 6, pp. 136–144.
"Solid State Amplifiers for DME Beacons", by D. Graziani, Face-Standard, Milan, Italy, Electrical Communication, vol. 50, No. 4, 1973, pp. 273–277.

Primary Examiner—James B. Mullins
Attorney, Agent, or Firm—Hill, Steadman & Simpson

[57] ABSTRACT

Modulation device for an RF power amplifier. A correction of the modulation pulse is defined from the non-linear control characteristic of the RF power amplifier (2) such that the influence on the desired output pulse shape caused by the non-linear control characteristic is first compensated for without involvement of a controller. When, due to disturbances acting on the amplifier, changes of the control characteristics or of the RF gain and, consequently deviations in the pulse shape and power occur, then the controller corrects these deviations during the pulse transmission. The modulation device is used in RF transistor power amplifiers having a pulse modulation input.

10 Claims, 2 Drawing Sheets

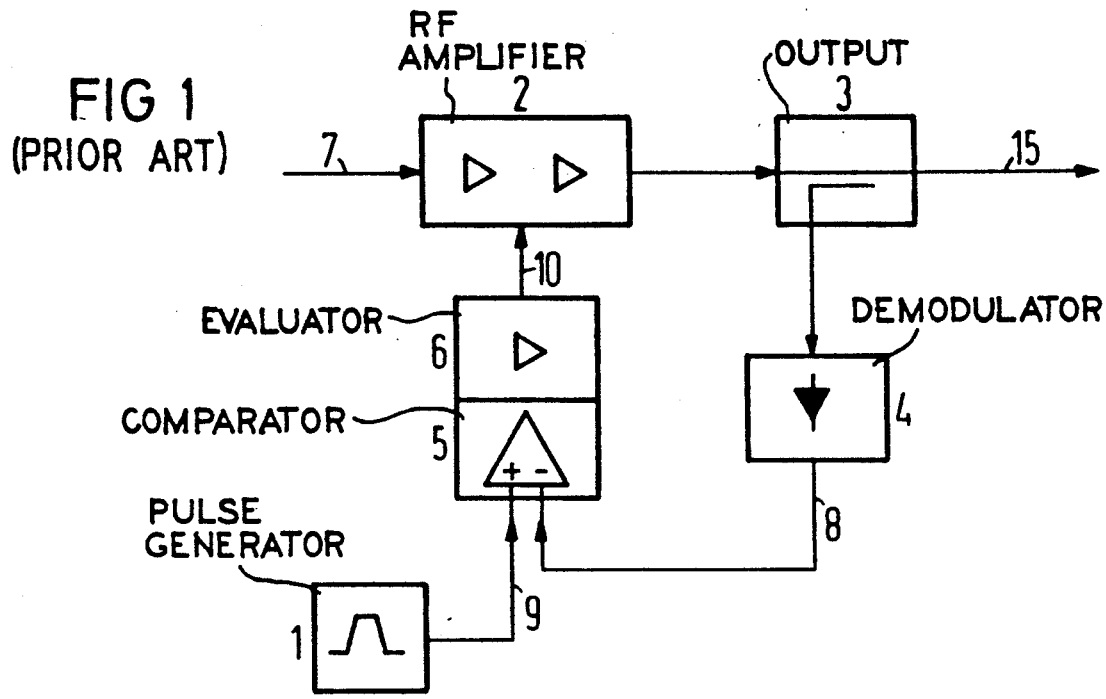
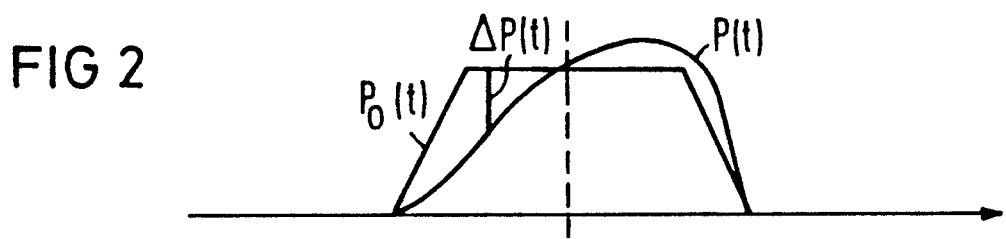
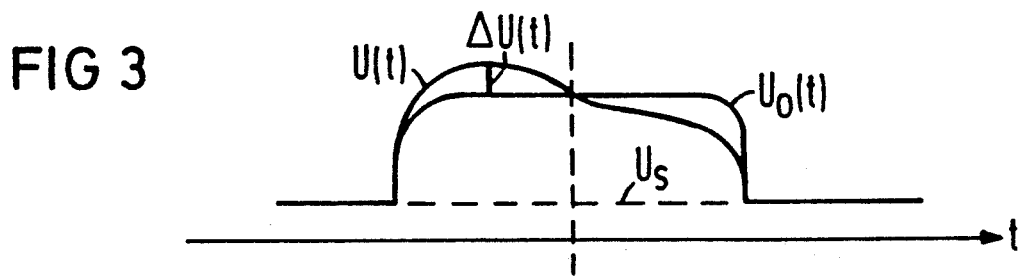

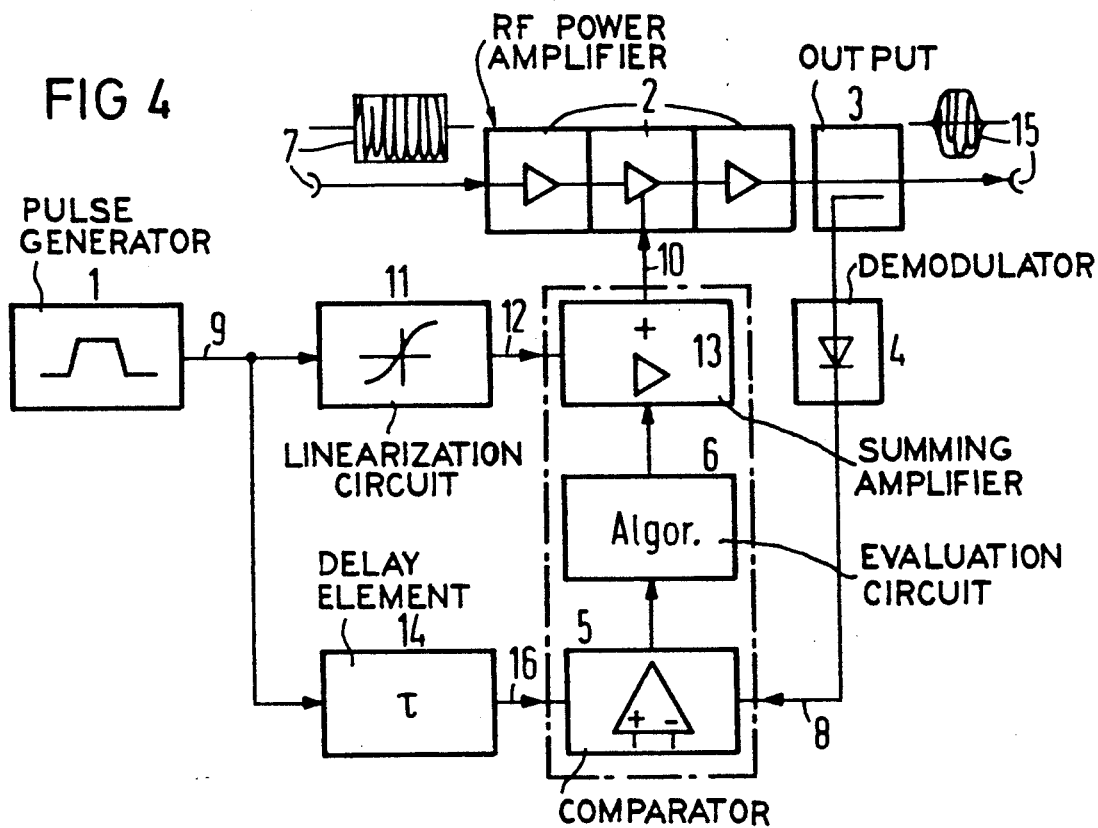
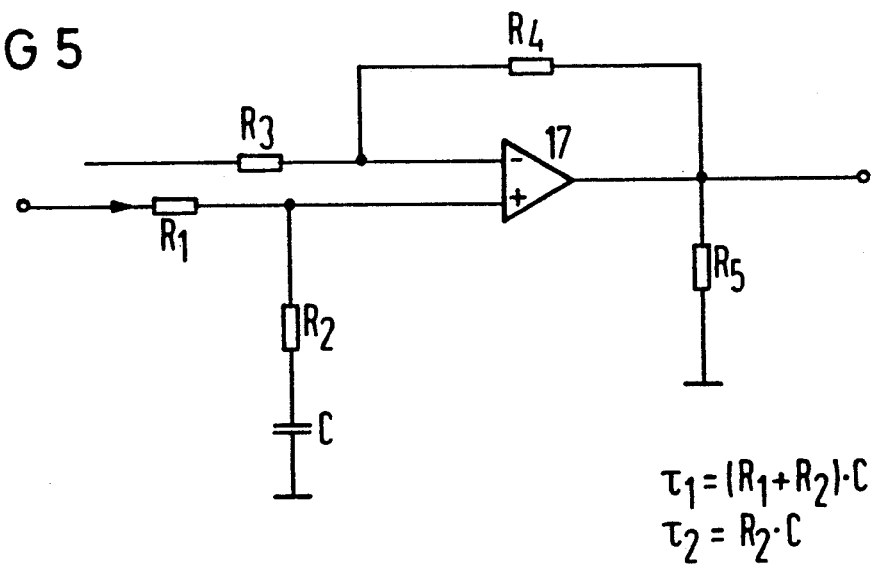
$\tau_1 = (R_1 + R_2) \cdot C$
$\tau_2 = R_2 \cdot C$

MODULATION MEANS FOR AN RF POWER AMPLIFIER

BACKGROUND OF THE INVENTION

The present invention is directed to a modulating means for an RF power amplifier having at least one RF power transistor.

In pulse power amplifiers having RF power transistors, pulse shaping corresponding to a prescribed envelope should be undertaken during the amplification of RF pulses to a high output power and the peak pulse power should achieve a desired value.

One of the critical disadvantages of RF power transistors is non-linear distortion of the pulse shape of the output power resulting from a pulsed mode. For example, this problem is known from German Patent 29 04 011 (corresponding to U.S. Pat. No. 4,322,689 hereby incorporated by reference).

Generating transmission pulses having a defined envelope basically represents an amplitude modulation. It is disclosed in German Patent 28 35 751 (corresponding to U.S. Pat. No. 4,286,236 hereby incorporated by reference) that the known teaching for the control of the modulation signal cannot be transferred without further processing to RF power amplifiers wherein the RF carrier oscillation is modulated with pulses. This is particularly true when the pulses have an extremely short pulse duration, for example 8 $\mu$sec. The time required in the prior art controls is too long for these applications.

It is well known that linearity in the amplification can be improved by using a negative feedback. The article by J. Stammelbach, "Probleme bei der Amplitudenmodulation von Transistorleistungsstufen" in the German periodical "Frequenz", Vol. 30, No. 6, Jun. 1976, pages 136–144 discloses a solution for linearization of the pulse shape in RF power amplifiers that is referred to as envelope negative feedback. This linearization possibility is explained with reference to FIG. 1. An RF input signal 7 is supplied to an RF amplifier 2. The part of the RF output pulse 15 branched off in an output means 3 and demodulated with a demodulator 4 is compared in a comparator 5, as actual pulse 8, to a rated pulse 9 that is supplied by a pulse generator 1. Any deviation is eliminated on the basis of a corresponding control of the modulation control voltage 10, except for a residual deviation that is dependent on the controlled gain of an evaluation circuit 6.

The aforementioned German Patent 28 35 751 discloses an RF power amplifier wherein a part of the modulated amplifier output signal is taken, rectified and compared to the rated modulation signal and wherein the actual modulation signal is pre-distorted in accordance with the result of the comparison such that the amplifier output signal has the desired curve.

It is disclosed in German Patent 32 21 911 that a great length of time is required in the known RF power amplifier for matching the actual pulse to the rated pulse if the actual signal deviates too greatly from the rated signal at the beginning of the correction. This is frequently the case when a switch is undertaken from a first to a second carrier frequency.

German Patent 32 91 911 discloses an RF power amplifier in detail, whereby the correction is implemented in the transmission pauses by using intermediate memories. In this case, the control loop is interrupted during the correction. Given the transmitter disclosed therein, a switch is undertaken after the transmission event from the operating mode of "transmitting" to the operating mode of "correcting". It is thereby assumed that the transmission signal has relatively long separations between the transmission pulses or between the pulse groups. This is the case in the distance measuring system DME or the navigation system TACAN.

In certain applications of RF power amplifiers, the pulse sequence is composed of 100 and more pulses per message, whereby the possibility exists of switching to a different carrier frequency and from a first to a second pulse format between two pulses. In these cases, time considerations make it impossible to suitably pre-distort the modulation signal using the disclosed amplifier since all rated and actual amplitude values of all pulses of a pulse group would have been compared to one another for correction.

Previously cited German Patent 29 04 011 discloses a radio-frequency pulse amplifier wherein an amplifier chain is controlled to a constant output power with an AGC control loop. Each of the transistor amplifier stages has a constant current source allocated to it. The control pulses for all constant current sources proceed via a common pulse shaping circuit and are set with respect to their voltage amplitude, namely by an AGC control voltage that is acquired dependent on the total actual output power of the amplifier stages in comparison to the rated output power to be held constant. The signal edges of the pulses output by the pulse shaping circuit that control the constant current sources align the signal edges of the radio-frequency pulses traversing the amplifier stages and can be structured based on certain requirements.

The AGC control loop thereby provided controls the output power of the amplifier stages dependent on the amplitude change of the envelope. The time constant in an AGC circuit is always selected to be of such length that an average DC voltage is formed from the successive radio-frequency pulses, the value of this average DC voltage being proportional to the amplitude of the RF pulses. This problem is discussed in German Patent 12 97 903. The envelope of the radio-frequency pulses can be acquired from the amplifier output signal on the basis of a corresponding selection of the time constant of the rectifier circuit.

The article, "Solid State Amplifiers for DME-Beacons" by D. Graziani in the periodical "Electrical Communication", Vol. 50, No. 4, 1975, pages 273–277 discloses a transistor power amplifier for DME applications wherein the modulation control pulse has a "pedestal". The reason for this modulation technique lies in the initial non-linearity of the control characteristic between the output power and the modulation pulse amplitude. The non-linearity at low modulation voltage effects a change of the pulse shape due to an abbreviation of the rise and decay times. The modulation technique recited therein on the basis of pre-distortion of the modulation control pulse has the disadvantage of being a pure control operation. Thermally conditioned or frequency-dependent changes of the amplifier characteristic during the pulse transmission influence the pulse shape and the output power in an undesirable manner. It is conceivable to acquire the non-linear amplifier characteristic in terms of its temperature and frequency dependency and to take this into consideration when shaping the modulation control pulse. In practice, deviations from the ideal shape of the modulation control pulses already result due to the measuring error in the identification of the non-linear amplifier characteristic or due to unit differences or due to a degradation during operation caused by aging effects. Influencing the modulation control signal dependent on the amplifier output signal could only be achieved on the basis of a control event in the form of negative feedback.

Pulse power amplifiers that generate pulse peak powers of 200 W and above into the GHz range use RF power transistors for pulsed operation. The transistors operate in the non-linear C-mode and are driven into the A-mode and B-mode only during keying (German Patent 29 04 011). Given such amplifiers, there is a non-linear characteristic between the modulation control voltage and the pulse output power that is output. The output power is zero below a "starting voltage" of the amplifier, then increases, for example, according to a quadratic function and reaches a saturation value at a defined modulation control voltage. A non-linear characteristic also results for the RF pulse amplifier recited in German Patent 29 04 011 that has a control on the basis of constant current sources, namely when a constant current source cannot be allocated to each of the transistor amplifier stages. For example, this is the case when minimum mechanical dimensions are required or when the output stage transistors require more than 10 A or when the dissipated power converted in the constant current sources cannot be reliably eliminated due to a pulse-duty factor of 20%.

A pulse shaping with a control loop corresponding to FIG. 1 is fundamentally impossible in such RF power amplifiers having non-linear control characteristic. As a consequence of the pronounced non-linearity at low modulation voltages, a pronounced, non-linear distortion of the output pulse shape occurs not only in the "pulse foot". In particular, the output power, as a function of the time, is zero until the modulation control voltage has reached a value of the "starting voltage" of the amplifier. This effect causes a chronological delay between the leading edges of the modulation control pulse and of the output pulse. The dead time of the amplifier resulting therefrom becomes all the longer the more slowly the modulation control voltage rises as a function of the time. Given pulse shapes having rise times on the order of magnitude of 1 $\mu$sec, abbreviations of the output pulse shape therefore occur that also cannot be corrected by an arbitrarily fast control algorithm since the acquired controlled quantity is zero during the dead time.

SUMMARY OF THE INVENTION

It is an object of the present invention to provide a measure for the modulation means of an RF power amplifier which guarantees that the RF output pulse of the RF power amplifier has a prescribed pulse shape nearly undistorted even for pulse formats wherein the time between the transmission of two transmission pulses is extremely short and no longer time segment is available for matching the output pulses to the desired rated pulse shape.

This object is achieved by a modulation means for an RF power amplifier having one or more RF power transistors, a small part of the amplified and modulated RF output signal of the RF power amplifier being coupled out and, as demodulated envelope actual pulse, being compared in a comparator to a rated modulation pulse output by a pulse generator. The comparison result of the comparator is used as a modulation control pulse for modulation. The pulse generator is connected to a linearization circuit wherein the rated pulse output by the pulse generator is corrected in accordance with the control characteristic of the RF power amplifier. The pulse corrected in the linearization circuit is supplied, as a control pulse, to a first input of a summing amplifier to whose second input the comparison result from the comparator is supplied via a weighting circuit that implements a weighting with a control algorithm in the fashion of a controller. The rated pulse taken from the pulse generator is also conducted through a delay element to the comparator. The delay time of the delay element corresponds to the signal delay time from the modulation control pulse to the output envelope actual pulse of the RF power amplifier caused substantially by the RF power transistors in the RF power amplifier. The output signal of the summing amplifier is supplied to the RF power amplifier as the modulation control pulse.

The present invention is based on linearizing the RF power amplifier with its modulation control stage as a controlled system. For the reason already recited, this linearization is not realized as a control operation having negative feedback. A linearization of the RF amplifier results in such a fashion that a correction of the modulation pulse is determined from the non-linear control characteristic such that the influence on the desired output pulse shape and power caused by the non-linear control characteristic is initially compensated without involvement of the controller. In terms of control technology, this corresponds to the linearization around a fixed operating condition, whereby this fixed value designates the desired operating status of the system.

Further developments of the present invention are as follows. The weighting circuit executes the control algorithm of a proportional-integral controller. The integration time of the proportional-integral controller is dimensioned at least as long as the signal delay time and maximally lies approximately one decade above the signal delay time. Also, the rated pulse can be taken from a programmable memory for digital signals, as well as, both the control pulse and the delayed reference pulse can be each taken from a respective programmable memory for digital signals. Furthermore, the comparator can be a differential amplifier.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 1 is a block diagram of a prior art envelope negative feedback circuit;

FIG. 2 and FIG. 3 depict pulse shapes of the envelope and of the modulation control pulse affecting the power or, respectively, the voltage;

FIG. 4 is a block diagram of an exemplary embodiment of a modulation means of the present invention; and FIG. 5 is an exemplary circuit of an evaluation circuit in the form of a PI controller.

DESCRIPTION OF THE PREFERRED EMBODIMENT

In the present case, the time-dependent envelope of the output power according to FIG. 2 should assume a desired pulse shape having a given pulse peak power and the control should guarantee adherence to this pulse shape. When P(t) is the time-dependent envelope, $P_o(t)$ is its desired pulse shape and $\Delta P(t)$ is the deviation of the envelope from the desired pulse shape, then $$P(t) = P_o(t) + \Delta P(t).$$

Without the influence of disturbances, the desired pulse shape $P_o(t)$ corresponds to a pulse shape $U_o(t)$ of the modulation control voltage (FIG. 3). When changes in the control characteristic or RF gain and, consequently, deviations of the pulse shape and power occur due to disturbances acting on the amplifier (for example, temperature and frequency changes or aging effects), then it is the function of the control to compensate for these deviations during the pulse transmission and to vary the modulation control voltage $U_o(t)$ in the sense of a negative feedback $\Delta U(t)$ until the deviation $\Delta P(t)$ is reduced. This behavior of the control is shown by way of example in FIG. 2 or, respectively, FIG. 3 for a trapezoidal envelope pulse $P_o(t)$ and a modulation control pulse $U_o(t)$ corresponding to a quadratic characteristic of the RF amplifier having a "starting voltage"-$'U_s$.

Under the influence of disturbances, an envelope pulse P(t) deviating from $P_o(t)$ would occur for pure control or open control loop and an unaltered modulation control pulse $U_o(t)$. Given a closed control loop, a modified modulation control pulse U(t) derives via the controller operation, this in turn affecting the envelope pulse $P_o(t)$ except for a residual deviation. When, based on these considerations, the fundamental structure of the control circuit in FIG. 1 is expanded by an additional control pulse for the linearization of the RF amplifier, then the control loop having a modified modulator circuit of the present invention results and is shown in FIG. 4.

The following structure derives in comparison to the illustration in FIG. 1:

The rated pulse 9 output by the pulse generator 1 is corrected in a linearization circuit 11 corresponding to the control characteristic of the RF power amplifier 2 and, as control pulse 12, is supplied via a first input of a summing amplifier 13 to the modulation input of the RF power amplifier 2.

Due to the finite modulation bandwidth and charge transport effects in the RF power transistors, an unavoidable signal delay time ("modulator delay time") $\tau m$ arises on the paths between the modulation control pulse 10 to the output envelope pulse 15. The acquired regulating variable (actual pulse 8) is still zero during this delay time and a pure control operation of the output pulse exists on the basis of the modulation control pulse 10. The rated/actual value comparison in a differential amplifier of the modulator that forms the comparator 5 can only occur after the modulator delay time $\tau m$, ensuing with the reference pulse 16 being delayed in a delay element 14 by the same delay time. The control operation thus only begins with the time delay $\tau m$.

The output signal of the differential amplifier 5 (deviation) is weighted in weighting circuit 6 (controller) with a control algorithm and is output therefrom to a second input of the summing amplifier 13. It is then added to the control pulse 12 on the first input of the summing amplifier 13.

The goal in the selection of the control algorithm is, first, to obtain high control precision and, second, to obtain short setting time of the control circuit in view of the unavoidable modulator delay time $\tau m$. The control precision can be enhanced when the gain of the controller is allowed to increase at low frequencies. This demand is met by a controller circuit that supplies an output voltage having the shape $$U_a = K_R \cdot X_d + K_R \cdot \frac{1}{T_i} \cdot \int X_d dt$$

(PI controller); where $K_R$ is proportional gain, $X_d$ is deviation, and $T_i$ is integration time.

A drastic shortening of the setting time of the control circuit is involved with the integral term. This derives therefrom that the maximally possible proportional gain of a P controller (proportional controller) is so low (due to the stability problems that occur) that a full modulation of the controlled system is not achieved even for large deviations. When an integral term is present, then a high output voltage rapidly sums up for large deviations such that a full modulation of the controlled system occurs. An integral term can therefore also be advantageous when it is not a high balancing precision but rather a short setting time that is of significance.

The controller characteristic is to be dimensioned in view of the modulator delay time $\tau m$. As a consequence of the modulator delay time, a correction of the modulation control pulse has only a delayed effect on the output pulse. An unstable behavior of the control loop can therefore occur.

The integration time $T_i$ of the PI controller should be dimensioned to be at least equal to the modulator delay time $\tau m$ and should maximally lie approximately one decade above $\tau m$. The limit frequency $\omega_2$ of the PI controller at which the integration effect of the circuit changes into a proportional dynamic systems behavior is comparable to the reciprocable of the modulator delay time. In view of the reference pulse shape, the gain of the PI controller is to be dimensioned at high frequencies such that the controller can sufficiently quickly bring deviations to zero.

A control circuit of FIG. 5 can be advantageously used in a practical embodiment of the PI controller. An operational amplifier 17 is provided to which the input signal is input at its positive input via a resistor-capacitor network R1, R2, C and that is negatively fed back from the output via a resistor voltage divider network $R_3$, $R_4$, $R_5$. The operational amplifier 17 has the two time constants $\tau_1 = (R_1 + R_2)C$ and $\tau_2 = R_2 \cdot C$. In terms of dynamic systems behavior, the selected realization corresponds to the ideal PI controller with the two restrictions that the band limitation by the operational amplifier begins above the limit frequency $\omega_3$ (overlaid low-pass filter behavior) and the gain of the controller is limited to a constant value below the limit frequency $\omega_1$. This measure was introduced in order to limit the loop gain of the control circuit in the quasi-stationary condition, for example during the pulse duration amplitude for trapezoidal rated pulses, in view of the range of modulation of the controller.

Whether the rise time of the respective signal edges of the pulse format is noticeably greater or is more likely to be comparable to the modulator delay time $\tau m$ is critical for the control behavior of the closed loop. In the former instance (this, for example, includes the TACAN pulse format), the control cannot only effectively correct the peak value of the power but also the course of the signal edges and of the pulse width or duration in the sense of the reference pulse.

In the second instance wherein the influence of the modulator delay time $\tau m$ is of consequence, a control of the pulse amplitude can only occur in the pulse duration amplitude since the action of the control occurs too late (due to delay time) in order to still have a correcting effect for the signal edges.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A modulation apparatus for an RF power amplifier having at least one RF power transistor, a small part of an amplified and modulated RF output signal of said RF power amplifier being coupled out and, as a demodulated envelope actual pulse, being compared in a comparator to a rated modulation pulse output by a pulse generator, the comparison result of said comparator used as a modulation control pulse, comprising: the pulse generator connected to a linearization circuit wherein the rated modulation pulse output by the pulse generator is corrected in accordance with a control characteristic of the RF power amplifier; the rated modulation pulse corrected in the linearization circuit supplied as a control pulse to a first input of a summing amplifier, a second input of the summing amplifier receiving the comparison result from the comparator via a weighting circuit that implements a weighting with a control algorithm; the rated modulation pulse output by the pulse generator conducted across a delay element to the comparator, the delay time of said delay element corresponding to a signal delay time from the modulation control pulse to the demodulated envelope actual pulse of the RF power amplifier caused substantially by the at least one RF power transistor in the RF power amplifier; and an output signal of the summing amplifier supplied to the RF power amplifier as a modulation control pulse.

2. The modulation apparatus according to claim 1, wherein the weighting circuit is a proportional-integral controller that executes the control algorithm.

3. The modulation apparatus according to claim 2, wherein an integration time of the proportional-integral controller is dimensioned at least as long as the signal delay time and maximally lies approximately one decade above the signal delay time.

4. The modulation apparatus according to claim 1, wherein the comparator is a differential amplifier.

5. A modulation apparatus for an RF power amplifier having at least one RF power transistor, the RF power amplifier outputting an amplified and modulated RF output signal, comprising:
means for coupling out a part of the RF output signal;
means for demodulating said part of the RF output signal to provide a demodulated envelope actual pulse on an output thereof;
pulse generator means for providing a rated modulation pulse on an output thereof;
delay element means for providing a delay time, said delay element having an input connected to said output of said pulse generator means and having an output;
comparator means for comparing said demodulated envelope actual pulse to said rated modulation pulse, said comparator having a first input connected to said output of said means for demodulating and a second input connected to said output of said delay element means, said comparator providing a comparison result on an output thereof;
means for weighting the comparison result having an input connected to said output of said comparator and having an output;
means for linearizing said rated modulation pulse having an input connected to said output of said pulse generator and providing a control pulse on an output thereof; and
means for summing the control pulse and the weighted comparison result, said means for summing having a first input connected to said output of said means for linearizing and a second input connected to said output of said means for weighting and providing a modulation control pulse on an output thereof to said RF power amplifier;
wherein, the delay time of said delay element corresponds to a signal delay time from the modulation control pulse to the demodulated envelope actual pulse of the RF power amplifier caused essentially by the RF power transistors in the RF power amplifier.

6. The modulation apparatus according to claim 5, wherein the means for weighting is a proportional-integral controller that executes the control algorithm.

7. The modulation apparatus according to claim 6, wherein an integration time of the proportional-integral controller is dimensioned at least as long as the signal delay time and maximally lies approximately one decade above the signal delay time.

8. The modulation apparatus according to claim 5, wherein the comparator means is a differential amplifier.

9. A modulation apparatus for an RF power amplifier having at least one RF power transistor, the RF power amplifier outputting an amplified and modulated RF output signal, comprising:
means for coupling out a part of the RF output signal;
means for demodulating said part of the RF output signal to provide a demodulated envelope actual pulse on an output thereof;
pulse generator means for providing a rated modulation pulse on an output thereof;
delay element means for providing a delay time, said delay element having an input connected to said output of said pulse generator means and having an output;
comparator means for comparing said demodulated envelope actual pulse to said rated modulation pulse, said comparator having a first input connected to said output of said means for demodulating and a second input connected to said output of said delay element means, said comparator providing a comparison result on an output thereof;

means for weighting the comparison result having an input connected to said output of said comparator and having an output;

means for linearizing said rated modulation pulse having an input connected to said output of said pulse generator and providing a control pulse on an output thereof;

means for summing the control pulse and the weighted comparison result, said means for summing having a first input connected to said output of said means for linearizing and a second input connected to said output of said means for weighting and providing a modulation control pulse on an output thereof to said RF power amplifier;

the delay time of said delay element corresponding to a signal delay time from the modulation control pulse to the demodulated envelope actual pulse of the RF power amplifier caused essentially by the RF power transistors in the RF power amplifier; and the means for weighting being a proportional-integral controller having an integration time that is dimensioned at least as long as the signal delay time and maximally lies approximately one decade above the signal delay time.

10. The modulation apparatus according to claim 9, wherein the comparator means is a differential amplifier.

* * * * *